(12) United States Patent
Renaud-Bezot et al.

(10) Patent No.: US 10,745,269 B2
(45) Date of Patent: Aug. 18, 2020

(54) MEMS PACKAGE

(71) Applicant: AT&S Austria Technologie & Systemtechnik Aktiengesellschaft, Leoben (AT)

(72) Inventors: Nick Renaud-Bezot, Leoben (AT); Bernhard Reitmaier, Möderbrugg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 163 days.

(21) Appl. No.: 15/525,704

(22) PCT Filed: Nov. 10, 2015

(86) PCT No.: PCT/EP2015/076153
§ 371 (c)(1),
(2) Date: May 10, 2017

(87) PCT Pub. No.: WO2016/075110
PCT Pub. Date: May 19, 2016

(65) Prior Publication Data
US 2018/0297834 A1    Oct. 18, 2018

(30) Foreign Application Priority Data
Nov. 10, 2014 (EP) .................... 14290340

(51) Int. Cl.
*H01L 27/14*   (2006.01)
*B81B 7/00*    (2006.01)
*B81C 1/00*    (2006.01)

(52) U.S. Cl.
CPC .............. *B81B 7/007* (2013.01); *B81B 7/008* (2013.01); *B81B 7/0061* (2013.01);
(Continued)

(58) Field of Classification Search
CPC .... H01L 2224/48; B81B 7/007; B81B 7/0061
See application file for complete search history.

(56) References Cited

U.S. PATENT DOCUMENTS 7,242,089 B2    7/2007  Minervini
7,829,961 B2   11/2010  Hsiao
(Continued)

FOREIGN PATENT DOCUMENTS

CN    101935007 A     1/2011
CN    104113811 A    10/2014
(Continued)

OTHER PUBLICATIONS

Office Action, State Intellectual Property Office of P.R. China, dated Jun. 5, 2018, 4 pp.
(Continued)

*Primary Examiner* — Phuc T Dang
(74) *Attorney, Agent, or Firm* — Robert A. Blaha; Smith Tempel Blaha LLC (57) ABSTRACT

A package includes a support structure having an electrically insulating material, a microelectromechanical system (MEMS) component, a cover structure having an electrically insulating material and mounted on the support structure for at least partially covering the MEMS component, and an electronic component embedded in one of the support structure and the cover structure. At least one of the support structure and the cover structure has or provides an electrically conductive contact structure.

13 Claims, 6 Drawing Sheets

(52) U.S. Cl.
CPC .......... *B81B 7/0064* (2013.01); *B81B 7/0067* (2013.01); *B81C 1/00301* (2013.01); *B81C 1/00873* (2013.01); *B81B 2201/02* (2013.01); *B81B 2201/0257* (2013.01); *B81B 2201/0264* (2013.01); *B81B 2201/03* (2013.01); *B81B 2201/036* (2013.01); *B81B 2201/04* (2013.01); *B81B 2201/042* (2013.01); *B81B 2201/05* (2013.01); *B81B 2201/10* (2013.01); *B81B 2207/012* (2013.01); *B81B 2207/095* (2013.01); *B81B 2203/0109* (2013.01); *B81C 2203/0785* (2013.01); *B81C 2203/0792* (2013.01)

(56) References Cited

U.S. PATENT DOCUMENTS

| | | | |
|---|---|---|---|
| 8,030,722 B1* | 10/2011 | Bolognia | B81B 7/0061 257/433 |
| 8,115,283 B1 | 2/2012 | Bolognia et al. | |
| 9,570,783 B1* | 2/2017 | Lee | H01P 1/15 |
| 2007/0158826 A1 | 7/2007 | Sakakibara et al. | |
| 2007/0215962 A1* | 9/2007 | Minervini | B81B 7/0064 257/414 |
| 2008/0122560 A1* | 5/2008 | Liu | B81B 7/0077 333/247 |
| 2009/0001553 A1* | 1/2009 | Pahl | B81B 7/0064 257/704 |
| 2010/0096712 A1* | 4/2010 | Knechtel | B81B 7/007 257/415 |
| 2010/0322451 A1* | 12/2010 | Wu | H04R 1/086 381/369 |
| 2011/0042762 A1* | 2/2011 | Laming | B81B 7/0077 257/416 |
| 2012/0033846 A1 | 2/2012 | Kaplan et al. | |
| 2012/0056279 A1* | 3/2012 | Huang | B81B 7/007 257/415 |
| 2012/0087521 A1* | 4/2012 | Delaus | B81C 1/00238 381/174 |
| 2013/0050155 A1 | 2/2013 | Petersen et al. | |
| 2013/0126992 A1 | 5/2013 | Ehrenpfordt et al. | |
| 2013/0140655 A1 | 6/2013 | Yeh et al. | |
| 2013/0193533 A1* | 8/2013 | Vos | H04R 19/005 257/416 |
| 2013/0299924 A1 | 11/2013 | Weber et al. | |
| 2013/0320465 A1 | 12/2013 | Huang et al. | |
| 2014/0231934 A1* | 8/2014 | Saito | B81B 7/0035 257/415 |
| 2014/0246739 A1* | 9/2014 | Protheroe | B81C 1/00269 257/416 |
| 2015/0091108 A1* | 4/2015 | Huang | B81B 7/0058 257/417 |
| 2017/0057808 A1* | 3/2017 | Chang | B81B 7/007 |

FOREIGN PATENT DOCUMENTS

| | | |
|---|---|---|
| WO | WO 2012051340 A1 | 4/2012 |
| WO | WO 2014052559 A1 | 4/2014 |

OTHER PUBLICATIONS

Office Action, State Intellectual Property Office of P.R. China, dated Dec. 5, 2018, 3 pp. (translated).
Office Action, European Patent Office, dated Jan. 21, 2019, 21 pp.

* cited by examiner

MEMS PACKAGE

CROSS-REFERENCE TO RELATED APPLICATIONS

The present application is a national phase application emerged from international patent application PCT/EP2015/076153, which claims the benefit of the filing date of European Patent Application No. 14 903 340.0, filed on November, 2014, the disclosures of which are hereby incorporated herein by reference in their entirety.

TECHNICAL FIELD

The invention relates to a package, a method of manufacturing packages, and an arrangement.

TECHNOLOGICAL BACKGROUND

MEMS (microelectromechanical systems) were first created with conventional semiconductor tools. Specific requirements, such as dimensions, material sets, shapes led to the development of dedicated processes. This disconnect from the origins meant that the control integrated circuits (IC) could not be manufactured on the same substrates as the MEMS itself. Even though CMOS (complementary metal oxide semiconductor) compatible processes have been introduced enabling single-chip MEMS/IC, the wide majority of MEMS applications separates the sensor/actuator from the controller.

U.S. Pat. No. 7,242,089 discloses a silicon condenser microphone package which includes a transducer unit, a substrate, and a cover. The substrate includes an upper surface transducer unit attached to the upper surface of the substrate and overlapping at least a portion of a recess, wherein a back volume of the transducer unit is formed between the transducer unit and the substrate. A cover is placed over the transducer unit and either the cover or the substrate includes an aperture.

US 2012/0033846 discloses a method for fabricating flat loudspeakers comprising manufacturing a flat loudspeaker including at least one micro speaker array, having first and second main surfaces; and covering at least one of the main surfaces of the loudspeaker with a cover member including an airtight sound-pressure wave transparent thin polymer film.

With continuous demand for smaller form factors and improved performance at lower costs, there is still room for improved packaging solutions for heterogeneous integration.

SUMMARY

There may be a need to provide a simply manufacturable and simultaneously compact MEMS package.

According to an exemplary embodiment of the invention, a package is provided which comprises a support structure comprising an electrically insulating material, a microelectromechanical system (MEMS) component (for instance mounted on the support structure), a cover structure comprising an electrically insulating material and mounted on the support structure for at least partially covering the MEMS component, and an electronic component embedded in one of the support structure and the cover structure, wherein at least one of the support structure and the cover structure comprises an electrically conductive contact structure.

According to another exemplary embodiment of the invention, a method of manufacturing packages is provided, wherein the method comprises providing a support structure which comprises an electrically insulating material, mounting a microelectromechanical system (MEMS) component (in particular on the support structure, alternatively on the below mentioned cover structure), mounting a cover structure, which comprises an electrically insulating material, on the support structure so as to at least partially cover the MEMS component, embedding an electronic component in one of the support structure and/or the cover structure, and providing at least one of the support structure and the cover structure with an electrically conductive contact structure.

According to still another exemplary embodiment of the invention, an arrangement (in particular as preform of the above mentioned package) is provided which comprises a support master structure comprising electrically insulating material, a plurality of MEMS components (for example mounted on the support master structure, additionally or alternatively mounted on the below mentioned cover master structure), and a cover master structure comprising electrically insulating material, mounted on the support master structure and at least partially covering the MEMS components so as to define individual cavities for each of the MEMS components between a corresponding section of the support master structure and a corresponding section of the cover master structure, and a plurality of electronic components embedded in at least one of the support master structure and/or the cover master structure, wherein at least one of the support master structure and the cover master structure comprises an electrically conductive contact structure.

In the context of the present application, the term "electronic component" may particularly denote any active electronic component (such as an electronic chip, in particular a semiconductor chip) or any passive electronic component (such as a capacitor). Examples of the embedded components may be a data storage memory such as a DRAM (or any other memory), a filter (which may for instance be configured as a high pass filter, a low pass filter or a bandpass filter, and which may for instance serve for frequency filtering), an integrated circuit (such as a logic IC), a signal processing component (such as a microprocessor), a power management component, an optical electrically interfacing member (for instance an optoelectronic member), a voltage converter (such as a DC/DC converter or an AC/DC converter), a cryptographic component, a capacitor, an inductance, a switch (for instance a transistor-based switch) and a combination of these and other functional electronic members.

According to an exemplary embodiment of the invention, a flat and compact MEMS package may be obtained in which an electronic component (such as a controller chip) may be mounted in an interior of a support structure or a cover structure and may control operation of the package, in particular of a MEMS component mounted on a surface of the support structure. The cover structure may cover at least part of the MEMS component (while the cover structure may remain spaced with regard to at least a part of the MEMS component so as to maintain free movability of a movable portion of the MEMS component), wherein both the support structure and the cover structure may be at least partially dielectric. An electric contacting of the electronic component and/or the MEMS component may be accomplished by electrically conductive contact structures formed on and/or in at least one of the support structure and the cover structure. With this architecture, a cheap and compact packaging design may be achieved. A cost-intensive metal cover or mold encapsulant may be omitted as cover structure which may be embodied as a cap of at least partially dielectric material. The dielectric cap-shaped architecture of the cover structure in combination with the mounting tasks of the support structure may be compatible with the use of a support master structure and a cover master structure, which may render it possible to manufacture a high number of packages in a parallel batch-like high through-put procedure. For this purpose, a for instance plate-based support master structure and a for instance plate-based cover master structure may be connected to one another with the MEMS components and the electronic components in between. The obtained arrangement may then be singularized into a large plurality of individual packages. Burying the electronic component within an interior of the support master structure or the cover master structure may allow to obtain a small mounting height and simplifies the batch processing. In addition to the smaller achievable footprint, the embedding of the at least one electronic component may have the further advantages of a better electronic performance and a lower energy consumption as a consequence of shorter conduction paths between the at least one electronic component and the at least one MEMS component.

In the following, further exemplary embodiments of the package, the method of manufacturing packages, and the arrangement will be explained.

In an embodiment, the MEMS component may be mounted on the support structure. Additionally or alternatively, the MEMS component may be mounted on the cover structure. The MEMS component may also be at least partially embedded in the support structure and/or in the cover structure.

Accordingly, the MEMS components may be mounted on the support master structure. Additionally or alternatively, the MEMS components may be mounted on the cover master structure. The MEMS components may also be at least partially embedded in the support master structure and/or in the cover master structure.

In an embodiment, the support structure may be configured as a circuit board, in particular a printed circuit board (PCB), or as a section thereof. Additionally or alternatively, the cover structure can be configured as a circuit board, in particular a printed circuit board (PCB), or as a section thereof. A circuit board may comprise a plurality of connected layer structures of electrically conductive material and electrically insulating material, and may in particular be plate shaped or flat. In the context of the present application, a "printed circuit board" (PCB) may denote a board of an electrically insulating material covered with electrically conductive material and conventionally serving for mounting thereon electronic members (such as packaged electronic chips, sockets, etc.) to be electrically coupled by the electrically conductive material. More specifically, a PCB may mechanically support and electrically connect electronic components using conductive tracks, pads and other features etched from copper sheets laminated onto an electrically non-conductive substrate. PCBs can be single sided (one copper layer), double sided (two copper layers) or of multi-layer type. Conductors on different layers may be connected with vertical interconnects such as plated-through holes or microvias. Such PCBs may contain components, such as capacitors, resistors or active devices, embedded in the substrate.

In this highly preferred embodiment, the support structure and/or the cover structure, further preferred both of them, may be manufactured as a circuit board such as a printed circuit board (PCB). Implementing PCB technology may promote a cost-efficient batch manufacturing process, since it may allow to use plate-shaped PCBs as basis for the support master structure and the cover master structure, respectively. Furthermore, this may allow to apply well-known and well-developed PCB procedures for MEMS packaging. It should however be said that other circuit board technologies, different from PCB technology, can be implemented also, for instance the use of ceramic substrates or flex boards.

In an embodiment, the electrically insulating material of at least one of the support structure and the cover structure may comprise at least one of the group consisting of resin (such as Bismaleimide-Triazine resin), glass fibers, prepreg material, polyimide, liquid crystal polymer, epoxy-based Build-Up Film and FR4 material. The resin material may serve as a matrix material having the desired dielectric properties and being cheap and highly appropriate for mass production. The glass fibers may reinforce the support structure or cover structure and may stabilize it mechanically. Furthermore, the glass fibers may introduce an anisotropic property of the respective support structure or cover structure, if desired. Prepreg may be a suitable material for any of the support structure and the cover structure, since it may be already a mixture of resin and glass fibers which can be further processed (and particular tempered) for converting it into PCB type dielectric material. FR4 is a flame-resistant dielectric material for PCBs which can be suitably used for the packaging concept according to exemplary embodiments.

It should furthermore be said that the electrically conductive contact structure can be made of a metal such as aluminum or copper. Copper may be particularly preferred in view of its high electric and thermal conductivity and its compatibility with PCB technology.

In an embodiment, the electronic component may be configured for functionally cooperating with (for instance controlling operation of) the MEMS component. Hence, the embedded at least one electronic component may serve as control IC for controlling operation of the MEMS. In this context, controlling may mean that the at least one electronic component may send control commands to the MEMS and/or may receive measurement signals from the MEMS component, for instance to further process them. It may also be possible that the electronic component provides an amplifier function for amplifying signals supplied to and/or received from the MEMS component.

It may be possible that one package contains only a single electronic component or a plurality of electronic components. It may further be possible that at least one further component is embedded within the support structure and/or the cover structure, for instance a copper block or a passive electronic component such as a resistor or a capacitor.

By embedding or integrating the at least one electronic component within the support structure and/or the cover structure, i.e. within an interior thereof, both the vertical space consumption (since surface mounting of the electronic component on the support structure or the cover structure can be omitted) as well as the lateral space consumption (due to the possibility to mount electronic component and MEMS component above one another) may be small, which may further promote a further miniaturization.

In an embodiment, the MEMS component may be configured as one of the group consisting of a sensor, an actuator, a loudspeaker, a microphone, a balanced armature receiver, an autofocus component, a two-dimensional scanner, a haptic actuator, a pressure sensor, a micropump, an adjustable lens, an adjustable wavelength selective filter, and a fluid sensor. A MEMS actuator can be denoted as a MEMS component which performs a motion task under control of the electronic component. For instance, such an actuator may be a loudspeaker emitting acoustic waves when being provided with corresponding electric signals indicative of the acoustic content to be reproduced, for instance by a piezoelectric membrane of the MEMS component. Also a scanner or a micropump may be examples of such a MEMS-type actuator, because it may be capable of displacing fluid (such as a gas and/or a liquid) when being activated with electric signals. A MEMS-type sensor may be a component which is capable of generating a sensor signal indicative of a property of the environment. An example may be a microphone which may generate an electric signal indicative of acoustic waves in an environment, for instance using a piezoelectric membrane of the MEMS-type sound wave sensor, or the like. Other examples for a MEMS-type sensor may be pressure sensors, or fluid (such as a gas and/or a liquid) sensors. An adjustable wavelength selective filter may be a MEMS component which, upon applying an electric voltage, characteristically may change its capacitance so as to be transmissive or reflective specifically for a certain wavelength of electromagnetic radiation such as light.

In an embodiment, the electronic component may be a semiconductor chip, in particular an application specific integrated circuit chip (ASIC). Hence, the at least one electronic component may be a semiconductor die embedded in a dielectric matrix of for instance resin-based material of the support structure. The support structure and/or cover structure in which the electronic component may be embedded shall be a non-semiconductor material. When the one or more electronic components are embodied as ASICs, it may be possible for a user to flexibly define the control tasks of the at least one electronic component for driving or otherwise operating the one or more MEMS components within a certain package.

However, the at least one electronic component may be also configured in another way than as a control chip, for instance may form a CCD (charge coupled device) and may therefore serve for detecting electromagnetic radiation, in particular captures image data. In such an embodiment, the CCD type electronic component may be for instance embedded in the support structure (with an upper surface of the CCD being exposed from the support structure) and may functionally cooperate with a MEMS-type adjustable lens (or a MEMS-type adjustable filter) mounted above the CCD type electronic chip so as to possibly serve as an adjustable optical element for influencing the electromagnetic radiation detected by the CCD.

In an embodiment, at least part of lateral surfaces of the electronic component may be in direct contact with material of at least one of the support structure and the cover structure. In particular, at least part of lateral surfaces of the electronic component may be covered with material of the support structure or the cover structure. Therefore, the at least one electronic component may be partially or fully embedded within the electrically insulating material of the support structure, and may nevertheless be in electric contact with the electrically conductive contact structure. Such an embedding can be performed by providing a precursor structure of the support or cover structure with one or more recesses at positions in which the at least one electronic component may be to be embedded. Subsequently, it may be optionally possible to add one or more additional layers of dielectric material and press together or laminate the various components of the support or cover structure with the at least one electronic component embedded therein, to thereby possibly complete the integral arrangement of support or cover structure on the one hand and electronic component on the other hand. Also a lower and/or an upper main surface of the at least one electronic component may be covered with material of the support or cover structure. It may however be possible that a portion of the at least one electronic component may protrude over an upper and/or a lower main surface of the support or cover structure.

In an embodiment, at least one of the group consisting of the support structure and the cover structure may comprise at least one through hole for providing fluid communication (in particular an air communication) between the MEMS component and an environment of the package. In this context, the term "fluid communication" may mean that a fluid (such as gas, in particular air, or liquid) is capable of flowing between an exterior and an interior of the package via the at least one through hole. A gas communication may also result in an acoustic communication between the MEMS component and an exterior of the package. By equipping at least one of the support structure and the cover structure with a respective through hole, an access of the capped MEMS component to the environment may be enabled. This may be particularly advantageous when the MEMS component shall sense an environmental property, i.e. may be configured as a MEMS-type sensor. But also in embodiments in which the MEMS component is an actuator, such an access hole may be advantageous to improve the functional coupling between the capped MEMS component and the environment. For example in an embodiment in which the MEMS component may act as a loudspeaker, one or more through holes in the support structure and/or the cover structure may be appropriate for promoting acoustic waves from propagating from the MEMS loudspeaker to the environment. In particular when the support structure and/or the cover structure is made of a PCB-type material, concepts for the formation of through holes as known from PCB technology can be advantageously applied to MEMS technology, for instance a formation of the through hole(s) by laser drilling or by a mechanical treatment.

In an embodiment, at least one of the group consisting of the support structure and the cover structure may be chamfered or may comprise any other type of grooving in an exterior surface portion of support structure and/or cover structure. More generally, the support structure and/or the cover structure may have an acoustic wave propagation influencing surface pattern which may be configured for influencing the characteristics according to which acoustic waves propagate in a proximity of the package. By chamfering support structure and/or cover structure, in particular in a region directly surrounding the at least one through hole formed therein, the respective properties of the package may be precisely adjusted, for instance in terms of its acoustical behavior. By such a chamfering it may be possible to improve wave propagation, filtering, and noise suppression. Chamfering around a through hole may smooth sharp edges at the through hole and may provide a funnel-shaped access for acoustic waves, thereby promoting the acoustic properties of the package.

In an embodiment, the MEMS component may be located in a cavity, in particular in a cuboid or a semispherical cavity, delimited between the support structure and the cover structure. In an embodiment, in which the MEMS component is located within a cavity defined between the support structure and the cover structure, the cover structure may serve as a cap. Hence, a void or air volume may remain between the MEMS component in the cavity and the borders of the cavity defined by support structure and cover structure. Capping the MEMS component rather than completely encapsulating it may allow to keep a movable or mechanical component of the MEMS component free and exposed to an environment which may further improve its sensitivity in terms of actuator and/or sensor. In particular when the cover structure or the cover master structure is based on a circuit board such as a printed circuit board, this flat body may be processed with simple means (for instance by a mechanical abrasion or chemically by etching) so as to possibly form the cavity in the cover structure or (in particular in a batch process) multiple cavities in the cover master structure.

In an embodiment, the cover structure may comprise an acoustic property adjustment feature, in particular a functionalization or a patterning for passive filtering. In particular, acoustic wave filtering may be promoted by forming a corresponding acoustic property adjustment feature at the package, in particular at the cover structure thereof. Therefore, shaping, functionalizing and patterning may allow to design the package with desired wave response properties. More generally, the acoustic property adjustment feature may be an arrangement of one or more microstructures, i.e. microprotrusions (such as solder dots) and/or microrecesses (such as indentations) located at an interior surface and/or an exterior surface of the cover structure to possibly manipulate the properties according to which acoustic waves propagate in a proximity of the cover structure. This can be combined with vertical structures creating a Faraday-cage effect to protect from EMI (electromagnetic interference) or ESD (electrostatic discharge) effects.

The cover structure may also be used for implementing simple soldering pads.

In an embodiment, the package may comprise bonding material at a mounting position between the support structure and the cover structure. Hence, the fixing of the cover structure (or the cover master structure) on the support structure (or the support master structure) may be accomplished by bonding material such as an adhesive, a solder, etc. This procedure may not only be particularly suitable for mass production on an industrial scale but may also allow to safely fix the components to one another to thereby improve reliability. The connection between the support structure and the cover structure may for instance be accomplished by soldering or mechanically pressing them together, preferably using bonding material in between.

In a particularly preferred embodiment, the bonding material may be configured for providing both a mechanical connection and an electric coupling between the support structure and the cover structure. In such an embodiment, the bonding material itself may be electrically conductive and may bridge a small gap between an electrically conductive contact structure of the support structure and an electrically conductive contact structure of the cover structure.

In an embodiment, at least part of the electrically conductive contact structure may be configured for electrically coupling the electronic component with the MEMS component. Integrating the electrically conductive contact structure in the support structure and/or the cover structure may allow to manufacture the package with a compact design and with short electrically conductive traces, thereby reducing signal propagation loss, noise development, and the like. Hence, a highly accurate and small sized package may be obtained.

In an embodiment, the method may further comprise mounting at least one further MEMS component on a support master structure, at least partially covering the at least one further MEMS component with a cover master structure mounted on the support master structure, and embedding at least one further electronic component in one of the support master structure and the cover master structure, wherein the support structure may form part of the support master structure, and wherein the cover structure may form part of the cover master structure. According to this highly preferred embodiment, a batch manufacture of a large plurality of packages (in particular at least 10, more particularly at least 100 packages) may be accomplished by first embedding multiple electronic components in the support master structure or in the cover master structure (each of which may be embodied as a printed circuit board), and by then placing multiple MEMS components on a surface of the support master structure, for example using a pick-and-place device. During this procedure, the MEMS components may be placed selectively on electrically conductive contact structures of the support master structure so that mechanical fixation and electrically contacting may be performed in one simultaneous procedure. For wire bonding, MEMS components can be die-attached to a non-conductive area. Subsequently, capping of multiple MEMS components may be accomplished by placing a common cover master structure on the arrangement of support master structure with embedded electronic components and mounted MEMS components to thereby possibly define a plurality of sections which may later serve as individual packages.

In an embodiment, the method may further comprise singularizing the arrangement of the support master structure, the cover master structure, the embedded electronic components and the mounted MEMS components to thereby obtain a plurality of packages. Each of these packages may comprise a support structure (i.e. a section of the support master structure), one or more of the electronic components, one or more of the MEMS components and a cover structure (i.e. a section of the cover master structure). This singularization can be performed by etching, laser cutting or sawing the arrangement along predefined separation lines. Therefore, all procedures of the packaging method may be carried out on a batch level, and the individual packages may be singularized at the very end.

In an embodiment, the electronic components and the MEMS components may be two dimensionally distributed over the support master structure and the cover master structure. For example, the individual packages (and with them the corresponding electronic components and MEMS components) may be arranged along a two-dimensional matrix, i.e. along rows and columns. This may be in perfect correspondence with the preferred use of a plate-based support master structure and a plate-based cover master structure, which may preferably be embodied as two printed circuit boards (PCB).

The aspects defined above and further aspects of the invention may be apparent from the examples of embodiment to be described hereinafter and are explained with reference to these examples of embodiment.

The invention will be described in more detail hereinafter with reference to examples of embodiment but to which the invention may not be limited.

DETAILED DESCRIPTION OF EXEMPLARY EMBODIMENTS

The illustrations in the drawings are presented schematically. In different drawings, similar or identical elements may be provided with the same reference signs.

Before, referring to the drawings, exemplary embodiments will be described in further detail, some basic considerations will be summarized based on which exemplary embodiments of the invention have been developed.

Exemplary embodiments of the invention may provide a concept concerning PCB-based packaging for MEMS sensors. One or more dice/electronic components and other electronic components may be placed on a substrate (also denoted as support master structure) in strip format. The assembly can rely on die-attach, flip-chipping, wirebonding, etc. to achieve electrical and mechanical connection. A second strip made of matching cavities (also denoted cover master structure) may be aligned and attached. This procedure can rely on having the bonding material (such as solder, epoxy, etc.) placed (for instance by dispensing, stamping, printing) on the substrate strip or the cavity one. After both strips are connected, individual packages may be singulated.

In order to let a pressure wave generated by a MEMS component escape the package (in the specific case of a loudspeaker), a hole may be formed in at least one of the elements, which does not have to be straight (for instance perpendicular to the substrate), but can have a complex shape through the PCB. This structure can additionally be chamfrained in order to improve propagation.

In a bottom port architecture, the hole may be located between solder pads. In a top port architecture, the hole may be on the other element (not aligned with the moveable membrane to avoid damage through particulate ingress). The top-port package may have a smaller footprint, but the bottom-port one may have a higher sensitivity due to its larger back volume. The port may not have to be straight, but can have a complex shape through the PCB.

In particular, providing a conduit of the package (in particular in the support structure thereof) along which acoustic waves may propagate between an exterior of the package and the MEMS component (at least partially) parallel to a membrane of the MEMS component may enable the creation of a balanced-armature receiver. Leaving the conduit open on one side (for example using the main substrate as closing element) may allow for thinner packages, arrangements and related devices.

An additional (preferably smaller) hole may be formed in the other element (i.e. support structure or cover structure) in order to possibly allow for the pressure to balance itself.

A cavity around the MEMS (in the specific case of a loudspeaker) may preferably be configured as close to a half-sphere as possible, in order to possibly avoid sound reflection, which might negatively affect device performance. For example, this can be achieved by drilling and/or milling with a spherical bit, or any other methods. One of the dice and some of the passives can also be embedded in one of the elements (i.e. support structure and cover structure) to reduce overall package dimensions and improve electrical performance.

For example, embodiments of the invention may provide an embedded loudspeaker and an embedded balanced-armature receiver. Exemplary embodiments of the invention can also be used for micro-mirrors and other similar actuators, microphones, pressure sensors, etc.

It is advantageous that membrane-based MEMS components may be enclosed as much as possible to protect the moveable element of the MEMS component, while still allowing both the membrane to move and air to reach it. In an embodiment, this can be achieved by using a PCB-based substrate for interconnection, and preferably a further PCB-based substrate for enclosure.

Hence, an exemplary embodiment of the invention may enable to create PCB-based loudspeakers and actuators, thereby possibly dramatically increasing production scale, and may reduce material and non-recurring engineering (NRE) costs. In comparison with a metal, exemplary embodiments of the invention may make it possible that the top side can be functionalized or patterned, for example to create passive filtering. The manufacturing concept according to exemplary embodiments may decrease production costs and enables integration of various functions.

When carrying out strip-to-strip bonding according to an exemplary embodiment, a high accuracy and a suppression of warpage can be advantageously obtained by temporarily clamping support master structure and cover master structure together during processing.

If a hermetic connection is made between the sensing element of the MEMS component and the hole (to prevent ingress, which could damage other parts of the system), the architecture would also be compatible with fluidic sensors.

An embodiment of the invention may improve conventional architectures by simplifying the assembly process (by using exactly two PCBs), thereby dramatically reducing the risk of misalignment (causing yield loss) and increasing production speed. In comparison with a metal can, the top side can even be functionalized or patterned to create passive filtering. This may come in addition to the simplified assembly processes and lower NRE costs. The process changes may decrease production costs.

Figure 1:
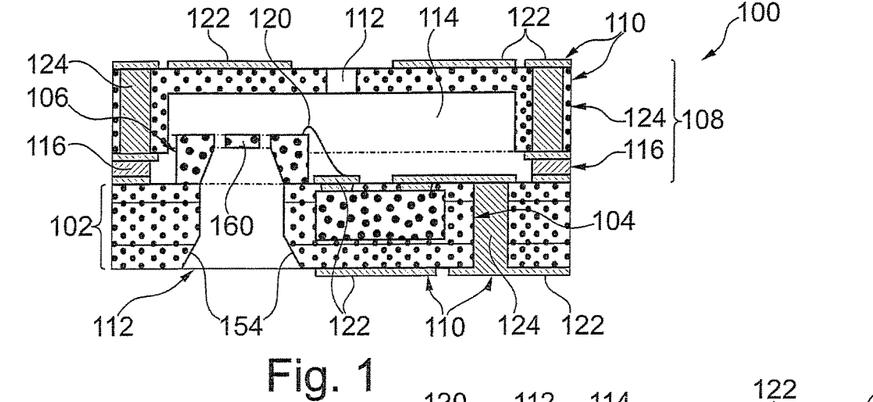
FIG. 1 shows a cross-sectional view of a package according to an exemplary embodiment of the invention.

FIG. 1 shows a cross-sectional view of a package 100 according to an exemplary embodiment of the invention. The package 100 of FIG. 1 may be embodied as a loudspeaker.

The package 100 may comprise a support structure 102 embodied as a section of a printed circuit board (PCB). Thus, the support structure 102 may comprise FR4 as an electrically insulating material and may comprise copper structures as electrically conductive contact structures 110 formed in and on the electrically insulating material. An electronic chip 104, here embodied as an ASIC, may be embedded within an interior of the support structure 102 so as to be fully or entirely surrounded by material of the support structure 102. The electronic chip 104 may hence be buried within the support structure 102. Correspondingly, the main surfaces and all lateral surfaces of the electronic chip 104 may be covered with material of the support structure 102. As can be taken from FIG. 1, the support structure 102 may be embodied as a PCB support structure in which the electronic chip 104 may be buried within FR4 material of the support structure 102.

A microelectromechanical system (MEMS) component 106 which may comprise an acoustic transducer membrane may be surface mounted on an upper main surface of the support structure 102, directly above a through hole 112 (which may also be denoted as a vent hole) formed in the support structure 102.

A cover structure 108 which may also be embodied as a section of a printed circuit board (PCB) may have been processed (for instance mechanically such as by drilling or chemically such as by etching) so as to have an internal hollow cavity 114. Hence, the cover structure 108 may serve as a cap. The cover structure 108 may comprise FR4 as an electrically insulating material and may comprise copper structures as electrically conductive contact structures 110 formed in and on the electrically insulating material. The MEMS component 106 may be located in the cavity 114 which may be delimited between the support structure 102 and the cover structure 108.

The cover structure 108 may be mounted on the support structure 102 for covering the MEMS component 106. The fixation of the cover structure 108 on the support structure 102 may be accomplished by bonding material 116 such as an adhesive. By providing an electrically conductive adhesive between sections of the electrically conductive contact structures 110 on either sides of the bonding material 116, the mechanical connection between the support structure 102 and the cover structure 108 may be performed simultaneously with the electric coupling between them. The cover structure 108 may here be embodied as a PCB-type cap which may accommodate the MEMS component 106 and nevertheless may maintain an air-filled cavity 114.

As can be taken from FIG. 1, a bond wire 120 may be foreseen so as to electrically couple the MEMS component 106 to the electronic chip 104 via the electrically conductive contact structure 110 of the support structure 102. Thus, the electrically conductive contact structure 110 may contribute to an electric coupling between the electronic chip 104 and the MEMS component 106. For reproducing audio content by emitting acoustic waves by the loudspeaker type package 100 towards the environment, electric signals indicative of this audio content may be supplied from the electronic chip 104 to the MEMS component 106 via the described electrically conductive connection. In another embodiment, in which the electronic chip 104 may be mounted in a flip chip configuration, the bond wire 120 may be omitted, and the electric coupling of the flip chip mounted electronic chip 104 may be accomplished by solder dots or copper pillars.

Each of the support structure 102 and the cover structure 108 may comprise a respective through hole 112 for providing an air communication between the MEMS component 106 and an environment of the package 100 so that acoustic waves may propagate from the MEMS component 106 to a surrounding of the package 100. An exterior portion of the through hole 112 formed in the support structure 102 may be provided with a chamfering section 154 to possibly improve the acoustic wave propagation properties between an interior and an exterior of the package 100.

In both the support structure 102 and the cover structure 108, the respective electrically conductive contact structure 110 may be configured to have components 122 which are surface layers patterned in order to obtain a desired conductive structure. However, the respective electrically conductive contact structure 110 may also comprise one or more vias 124 vertically extending through the respective PCB-type support structure 102/cover structure 108 and connecting layer-shaped portions of the electrically conductive contact structure 110.

The embedding of the control chip, i.e. electronic chip 104, into the PCB type support structure 102 as well as the substantially vertical arrangement of electronic chip 104 and MEMS component 106 may result in a compact design of the package 100. A correspondingly achievable miniaturization may further be supported by the flat plate-based architecture of both the support structure 102 and the cover structure 108. Despite of its plate shape, the cover structure 108 may furthermore provide a cap function, and can be also be used for a batch-type processing together with the also plate-based support structure 102.

Figure 2:
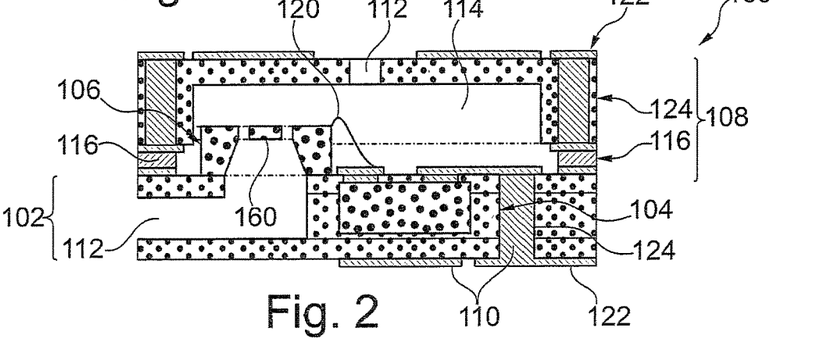
FIG. 2 shows a cross-sectional view of a package according to another exemplary embodiment of the invention.

FIG. 2 shows a cross-sectional view of a package 100 according to another exemplary embodiment of the invention. In contrast to the package 100 of FIG. 1, the package 100 of FIG. 2 may be embodied as a balanced armature receiver.

A further difference between the package 100 of FIG. 2 and the package 100 of FIG. 1 in that the lower through hole 112, serving as vent hole, may not be arranged at a bottom side of the support structure 102 according to FIG. 2, but at a lateral side. Thus, according to FIG. 2, the package 100 may be attached on its bottom side to a mounting substrate (not shown, for instance a PCB) without any limitations in terms of keeping the lower through hole 112 exposed to the environment. The vent air conduit constituted by the lower through hole 112 may therefore be aligned partially parallel to the membrane 160 of the MEMS component 106.

Figures 3, 4:
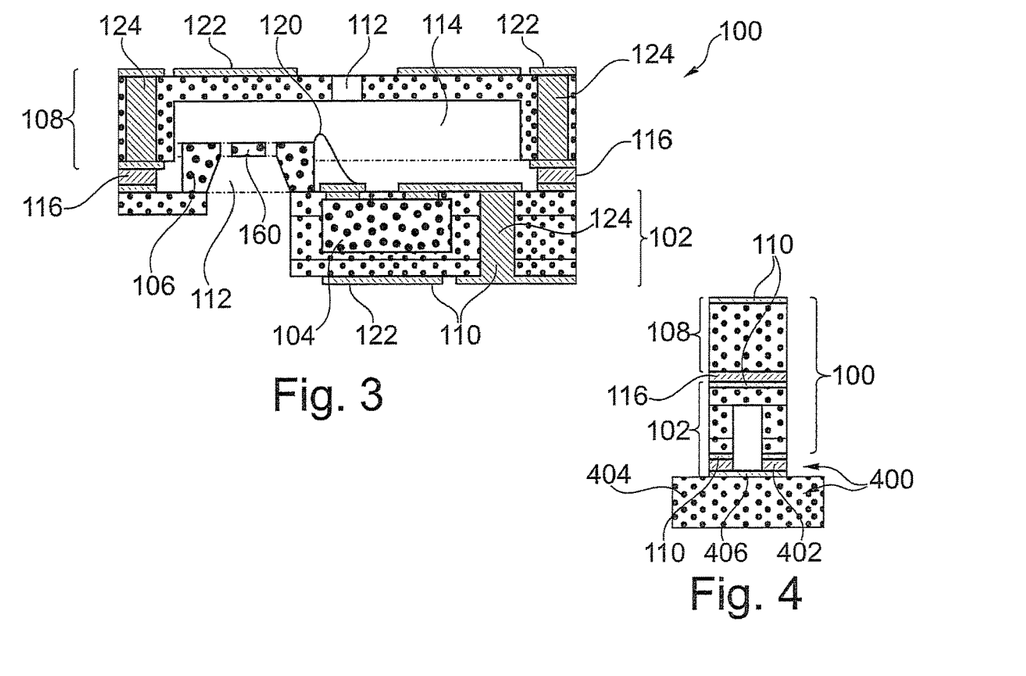
FIG. 3 shows a cross-sectional view of a package according to yet another exemplary embodiment of the invention.
FIG. 4 shows a side view of the package of FIG. 3 on a substrate embodied as printed circuit board.

FIG. 3 shows a cross-sectional view of a package 100 according to another exemplary embodiment of the invention. The package 100 of FIG. 3 may be embodied as a partially balanced armature receiver.

The package according to FIG. 3 may differ from the package according to FIG. 1 and FIG. 2 in that its bottom may have a step shape which may allow a lower portion on the right-hand side to be used as a mounting surface while possibly keeping the lower through hole 112 free as a consequence of the step shape.

FIG. 4 shows a cross-sectional view of the package 100 according to FIG. 3 mounted on a substrate 400 via a bonding material 402. The substrate 400 may here be embodied as a printed circuit board (PCB) having an electrically insulating core 404 and an electrically conductive wiring 406 by which the substrate 400 is electrically coupled to the package 100. Hence, FIG. 4 may show a receiver on a PCB.

Figure 5:
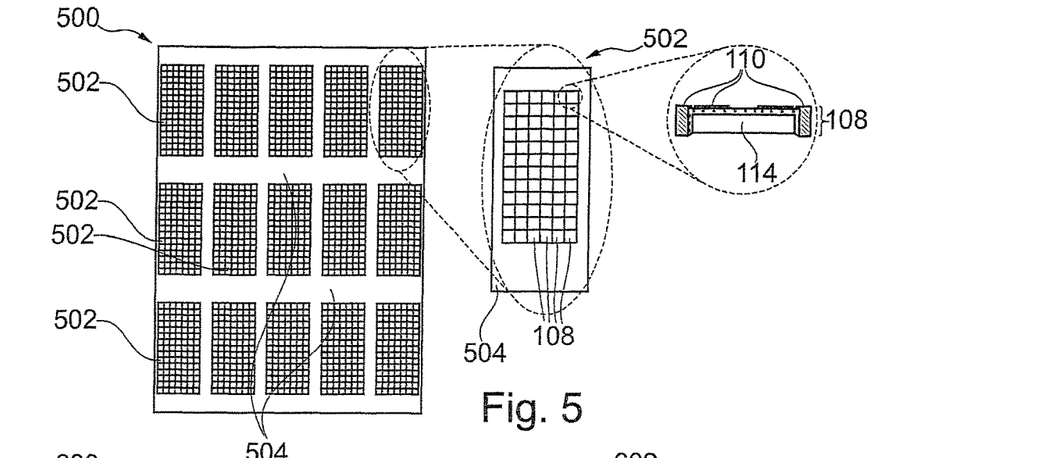
FIG. 5 shows a cover master structure (which may also be denoted as cavity panel) of an arrangement according to an exemplary embodiment of the invention.

FIG. 5 shows a cover master structure 500 of an arrangement according to an exemplary embodiment of the invention. As can be taken from FIG. 5, the cap- and PCB-type cover master structure 500 may be manufactured on the basis of a printed circuit board substrate shown on the left-hand side of FIG. 5. On the processed printed circuit board surface as support master structure 500, a plurality of package formation sections 502 may be formed which may be arranged in rows and columns, i.e. in a matrix-like pattern. Between subsequent package formation sections 502, respectively inactive areas 504 may be formed. In each of the package formation sections 502, a plurality of cover structures 108 may be formed, in turn, in a matrix-like pattern, i.e. also in rows and columns.

Figure 6:
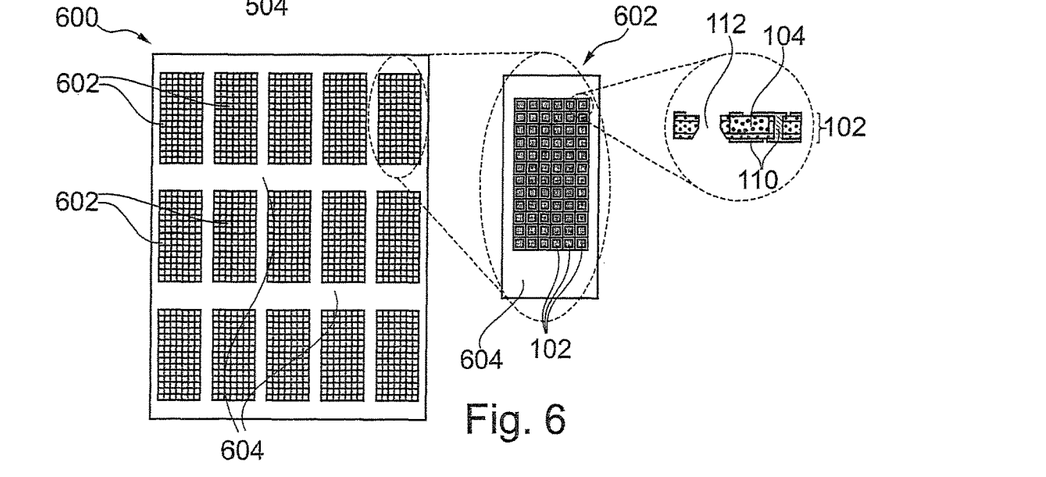
FIG. 6 shows a support master structure (which may also be denoted as integrated circuit substrate panel) of an arrangement according to an exemplary embodiment of the invention.

FIG. 6 shows a support master structure 600 of an arrangement according to an exemplary embodiment of the invention. In a similar way as described referring to FIG. 5, the support master structure 600 may also comprise a plurality of package formation sections 602 formed in rows and columns with inactive regions 604 between the respective package formation sections 602. Again, each of the package formation sections 602 may comprise a plurality of the support structures 102 which may be arranged as well as in rows and columns, i.e. in a matrix-like pattern. Although not shown in FIG. 6, the MEMS components 106 may be mounted on the support structure 102 shown in FIG. 6 on the through hole 112.

For manufacturing packages 100 in a batch procedure, the cover master structure 500 may be attached on top of the support master structure 600 and may be connected thereto by adhesive material or the like. Each package formation section 502 may thereby be aligned with regard to a corresponding package formation section 602. Also the inactive regions 504, 604 may be in alignment with one another. Subsequently, singularization of the so obtained arrangement (compare reference numeral 1100 in FIG. 11) into a plurality of packages 100 may be carried out.

Figure 7:
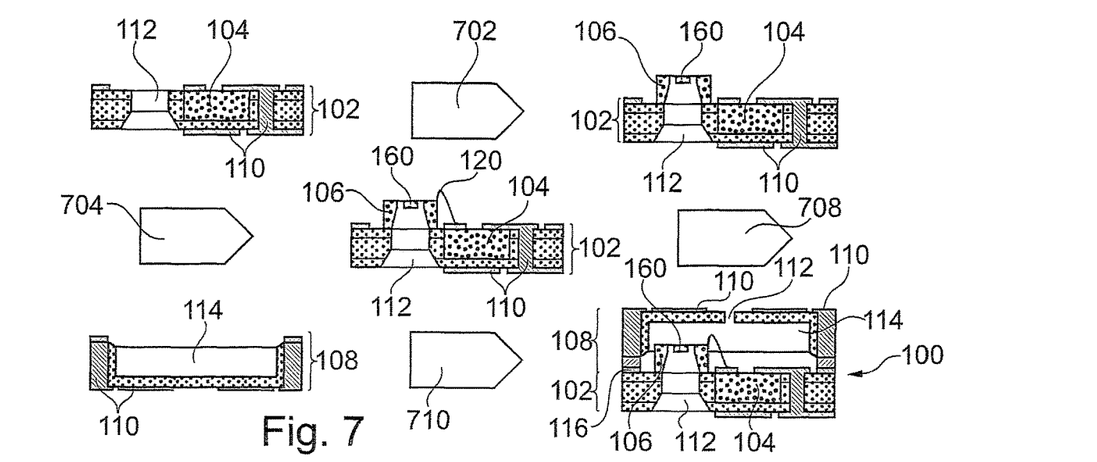
FIG. 7 shows a schematic view illustrating MEMS packaging procedures carried out during a method of manufacturing packages according to another exemplary embodiment of the invention.

FIG. 7 shows schematically shows procedures of a method of manufacturing packages 100 according to another exemplary embodiment of the invention. In other words, FIG. 7 may illustrate a part of the manufacturing procedure for manufacturing packages 100 according to an exemplary embodiment.

As can be taken from reference numeral 702, the MEMS component 106 may be connected to the support structure 102 by die bonding. As can be taken from reference numeral 704, the MEMS components 106 may then be electrically connected to the electronic chip 104 by wire bonding, i.e. by formation of wire bonds 120. As can be taken from reference numeral 708, a cavity 114 for later accommodating the MEMS component 106 may then be formed as part of cover structure 108. As can be furthermore taken from reference numeral 710, a strip-to-strip bonding (i.e. a connection of the cover master structure 500 of FIG. 5 and the support master structure 600 of FIG. 6) and subsequently a singularization of the so obtained arrangement into individual packages 100 may then be carried out.

Figure 8:
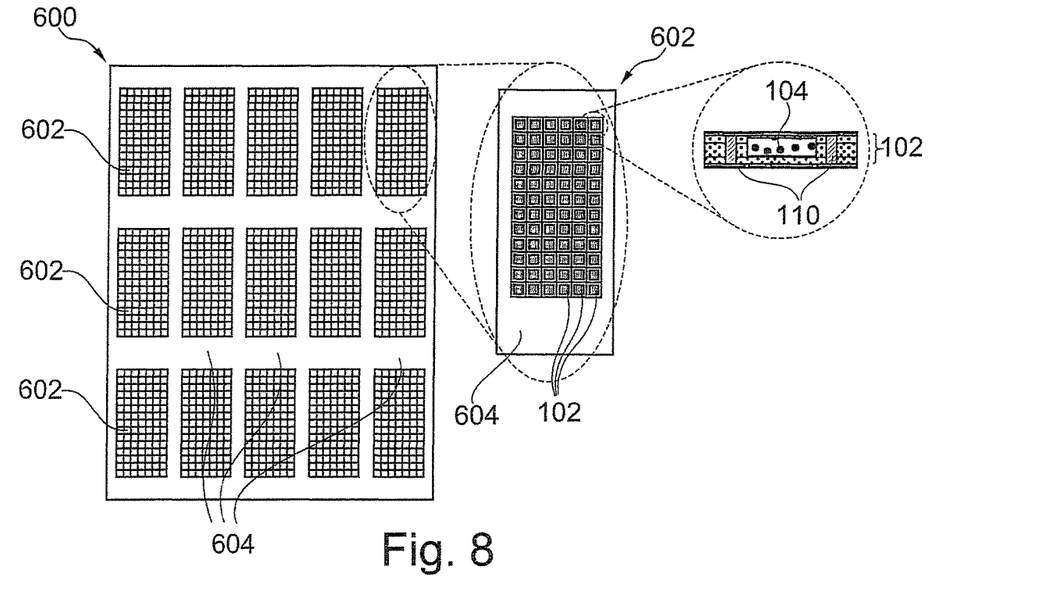
FIG. 8 shows a support master structure of an arrangement according to another exemplary embodiment of the invention.
Figure 9:
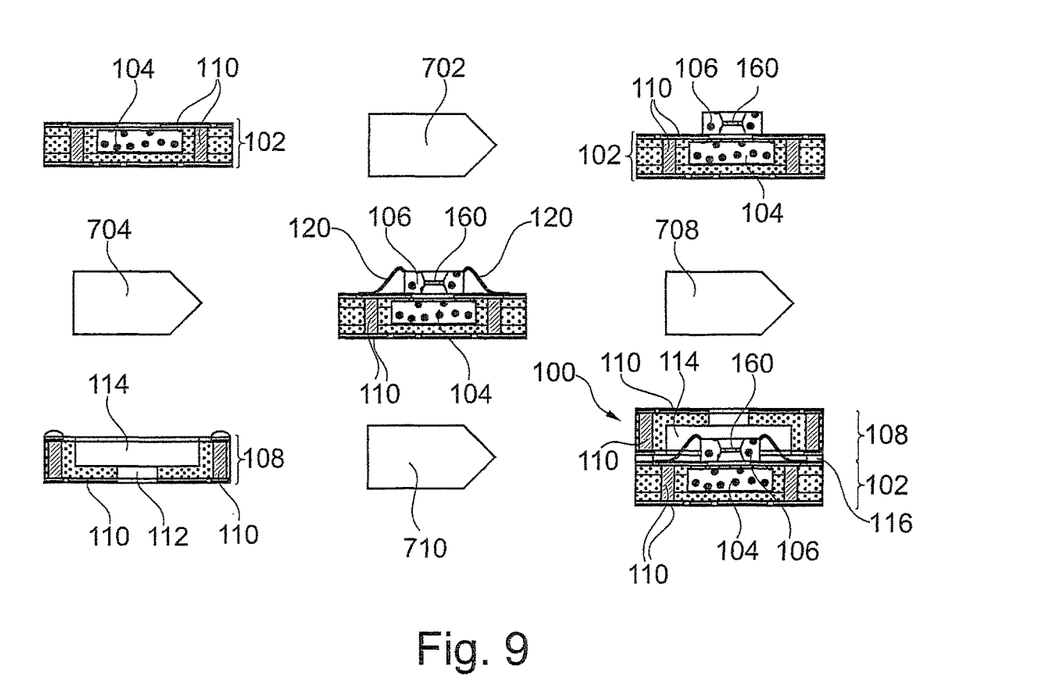
FIG. 9 shows a schematic view illustrating a method of manufacturing packages according to another exemplary embodiment of the invention.
Figure 10:
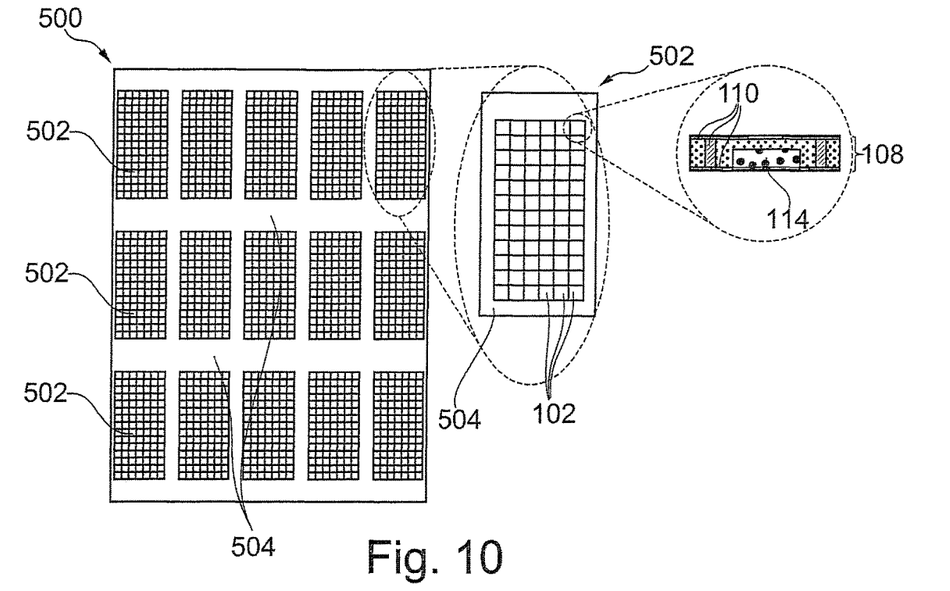
FIG. 10 shows a cover master structure of an arrangement according to another exemplary embodiment of the invention.

FIG. 8, FIG. 9 and FIG. 10 show a very similar procedure as FIG. 5 to FIG. 7, wherein FIG. 8 corresponds to FIG. 6, FIG. 9 correspond to FIG. 7 and FIG. 10 corresponds to FIG. 5. The difference between the embodiment of FIG. 8 to FIG. 10 compared to the embodiment of FIG. 5 to FIG. 7 may be that different support structures 102 and different cover structures 108 may be implemented. According to FIG. 8 to FIG. 10, the respective MEMS component 106 may be located directly above the electronic chip 104 rather than laterally displaced, as according to FIG. 5 to FIG. 7.

Figure 11:
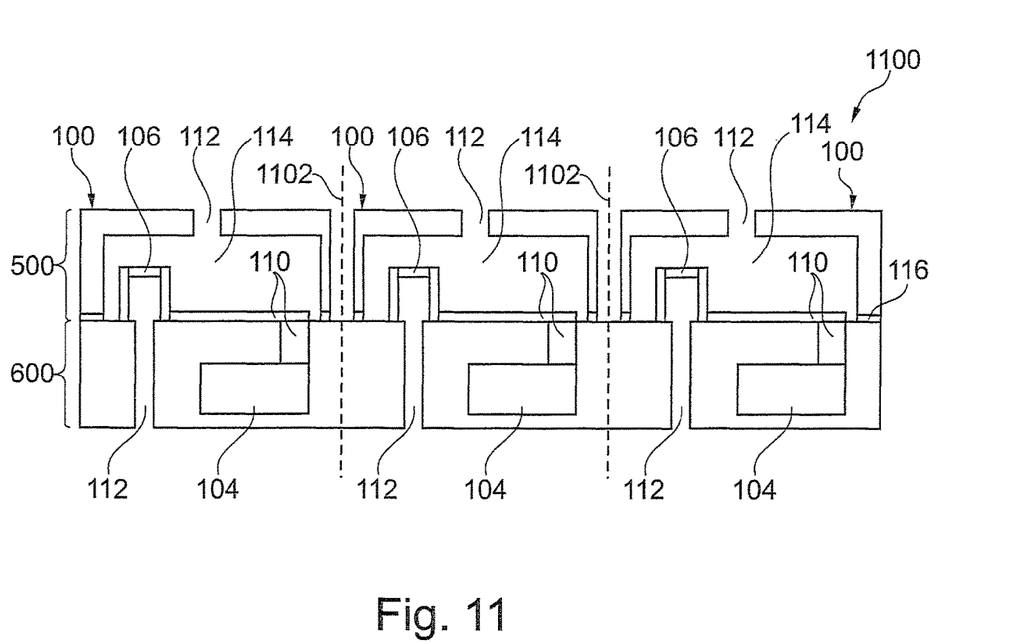
FIG. 11 shows a cross-sectional view of an arrangement according to an exemplary embodiment of the invention.

FIG. 11 shows a cross-sectional view of an arrangement 1100 according to another exemplary embodiment of the invention.

The arrangement 1100 may comprise PCB based support master structure 600, a plurality of electronic chips 104 embedded in the support master structure 600, a plurality of MEMS components 106 on the support master structure 600, and PCB based cover master structure 500 mounted on the support master structure 600 and covering the MEMS components 106 so as to possibly define individual cavities 114 for each of the MEMS components 106 between a corresponding section of the support master structure 600 and a corresponding section of the cover master structure 500. The arrangement 1100 shown in FIG. 11 may show a cross-sectional view of the individual packages 100. Along separation lines 1102, a singularization of the arrangement 1100 into the various packages 100 according to exemplary embodiments of the invention may be accomplished. This can be performed by laser cutting, sawing, etching, or the like.

Figure 12:
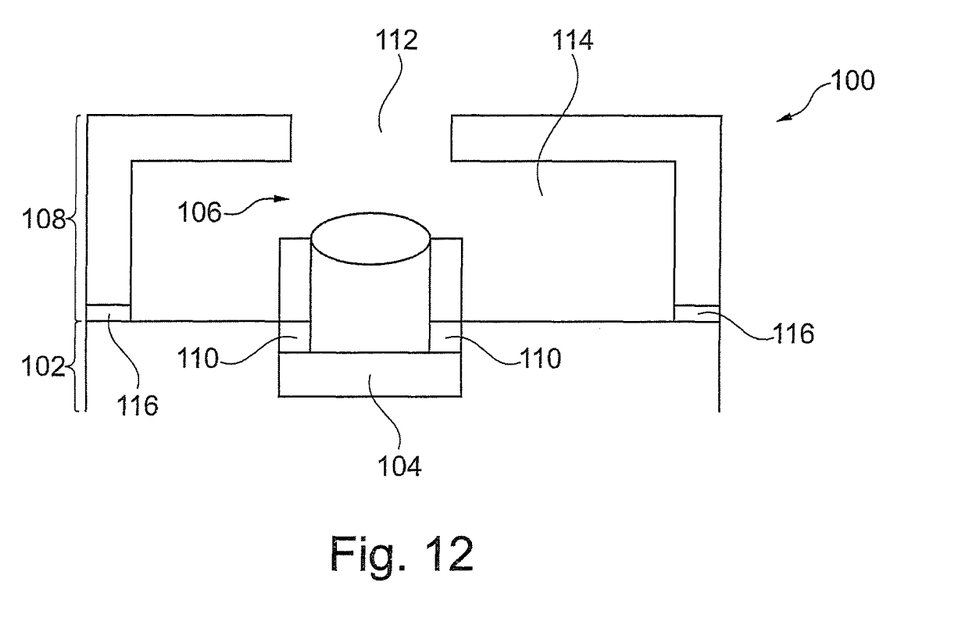
FIG. 12 shows a cross-sectional view of a package according to another exemplary embodiment of the invention.

FIG. 12 shows a cross-sectional view of a package 100 according to another exemplary embodiment of the invention. According to FIG. 12, the electronic chip 104 may be a light-sensitive CCD (charge coupled device) chip configured for detecting image data. The CCD type electronic chip 104 may be embedded in the support structure 102 and may cooperate with a MEMS-type adjustable lens as MEMS component 106 being mounted above the CCD type electronic chip 104. Based on an electric control signal supplied from the CCD chip 104 to the MEMS component 106, the MEMS type lens may modify its curvature and/or position and may therefore change the optical properties of light propagating towards the CCD type electronic chip 104. In the embodiment of FIG. 12, at least a portion of the cover structure 108 above the MEMS component 106 and the electronic chip 104 should be optically transparent or should have a through hole 112 allowing light to propagate into the cavity 114.

Figure 13:
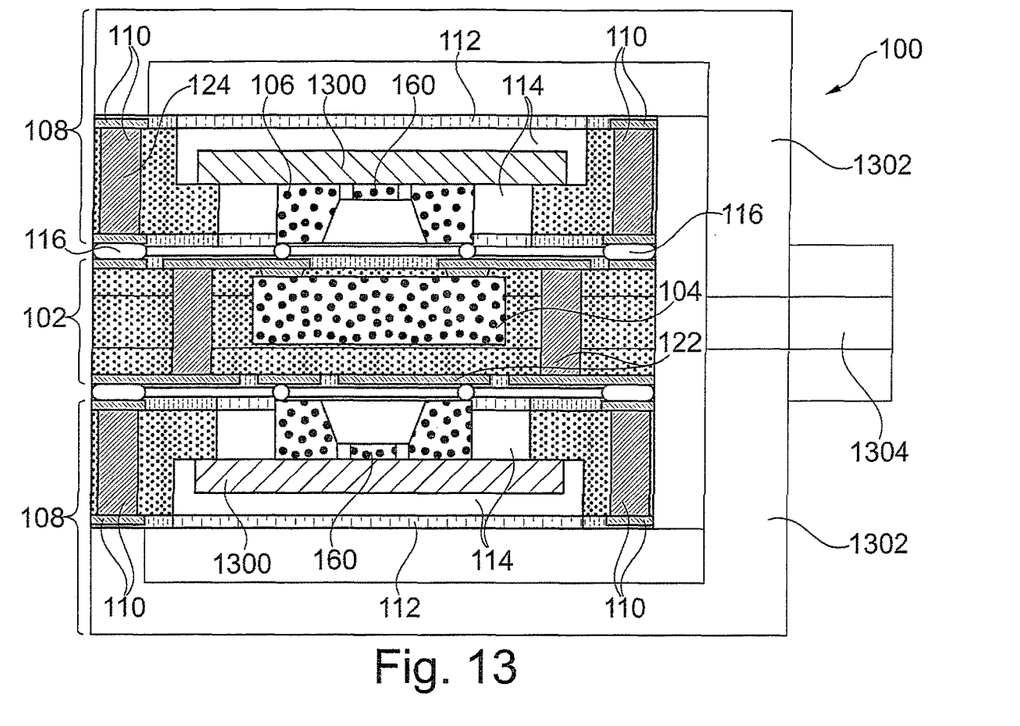
FIG. 13 and FIG. 14 show cross-sectional views of packages according to exemplary embodiments of the invention.
Figure 14:
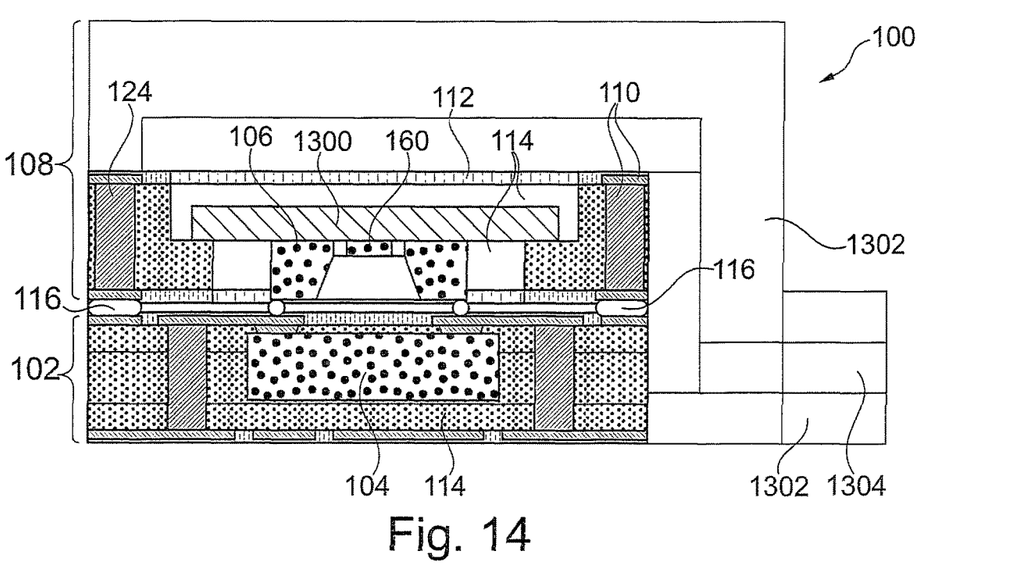

FIG. 13 and FIG. 14 show cross-sectional views of packages 100 according to exemplary embodiments of the invention.

The package 100 shown in FIG. 13 may be configured as a balanced armature receiver (BAR) having a dual sided configuration. This may mean that a support structure 102 with embedded electronic component 104 may be covered on each of its two opposing main surfaces by a respective MEMS component 106 being, in turn, covered by a respective cover structure 108. In addition, a membrane 1300 may cover an exposed surface of the respective MEMS component 106. The membrane 1300 may for instance be made of silicone or any other polymer material. Thus, a compact design can be combined with a high level of functionality. FIG. 13 furthermore shows a casing 1302 (for instance of metal or of plastic) which may serve as acoustic waveguide and may comprise an acoustic wave access opening 1304.

The package 100 shown in FIG. 14 may be configured as a balanced armature receiver (BAR) having a single sided configuration. This may mean that a support structure 102 with embedded electronic component 104 may be covered on only one of its two opposing main surfaces with a MEMS component 106, which may, in turn, be covered by a membrane 1300 and surrounded by a cover structure 108. Also the embodiment of FIG. 14 may comprise a casing 1302 which may be configured correspondingly to the casing 1302 of FIG. 13.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

Implementation of the invention may not be limited to the preferred embodiments shown in the figures and described above. Instead, a multiplicity of variants may be possible which may use the solutions shown and the principle according to the invention even in the case of fundamentally different embodiments.

The invention claimed is:

1. A package, comprising:
    a support structure comprising an electrically insulating material;
    a microelectromechanical system (MEMS) component;
    a cover structure comprising an electrically insulating material, wherein the cover structure is configured as a printed circuit board, or as a section thereof,
    wherein the cover structure has a cavity, and
    wherein the cover structure is mounted on the support structure for at least partially covering the MEMS component such that the MEMS component is at least partially located in the cavity; and
    an electronic component embedded in one of the support structure and the cover structure;
    wherein at least one of the support structure and the cover structure comprises an electrically conductive contact structure; and
    wherein the package further comprises at least one of the following features: wherein the MEMS component is mounted on the support structure and/or on the cover structure;
    wherein at least part of lateral surfaces of the electronic component is in direct contact with material of at least one of the support structure and the cover structure;
    wherein at least one of the group consisting of the support structure and the cover structure comprises at least one through hole for providing fluid communication between the mems component and an environment of the package;
    wherein at least one of the group consisting of the support structure and the cover structure has an acoustic wave propagation influencing surface pattern;
    wherein the mems component is located in a cavity delimited between the support structure and the cover structure;
    wherein the cover structure comprises at least one of the group consisting of an electromagnetic interference protection, an electrostatic discharge protection, solder pads, and an acoustic property adjustment feature, for passive filtering of acoustic waves;
    wherein at least part of the electrically conductive contact structure is configured for electrically coupling the electronic component with the mems component.

2. The package according to claim 1, wherein the support structure is configured as a circuit board.

3. The package according to claim 1, wherein the electrically insulating material of at least one of the support structure and the cover structure comprises at least one of the group consisting of resin, Bismaleimide-Triazine resin, glass fibers, prepreg material, polyimide, liquid crystal polymer, epoxy-based Build-Up Film, and FR4 material.

4. The package according to claim 1, wherein the electronic component is configured for functionally cooperating with the MEMS component.

5. The package according to claim 1, wherein the MEMS component is configured as one of the group consisting of a sensor, an actuator, a loudspeaker, a balanced armature receiver, a microphone, an autofocus component, a scanner, a two-dimensional scanner, a haptic actuator, a pressure sensor, a micropump, an adjustable lens, an adjustable wavelength selective filter, and a fluid sensor.

6. The package according to claim 1, wherein the electronic component is a semiconductor chip, an application specific integrated circuit chip (ASIC).

7. The package according to claim 1, comprising bonding material at a mounting position between the support structure and the cover structure.

8. The package according to claim 7, wherein the bonding material is configured for providing both a mechanical connection and an electric coupling between the support structure and the cover structure.

9. A method of manufacturing packages, comprising:
    providing a support structure which comprises an electrically insulating material;
    mounting a microelectromechanical system (MEMS) component on the support structure;
    processing a cover structure so as to have a cavity in the cover structure;
    mounting the cover structure, which comprises an electrically insulating material, wherein the cover structure is configured as a printed circuit board, or as a section thereof, on the support structure so as to at least partially cover the MEMS component such that the MEMS component is at least partially located in the cavity;
    embedding an electronic component in one of the support structure and the cover structure; and
    providing at least one of the support structure and the cover structure with an electrically conductive contact structure;
    wherein the package further comprises at least one of the following features:
    wherein the MEMS component is mounted on the support structure and/or on the cover structure;
    wherein at least part of lateral surfaces of the electronic component is in direct contact with material of at least one of the support structure and the cover structure;
    wherein at least one of the group consisting of the support structure and the cover structure comprises at least one through hole for providing fluid communication between the mems component and an environment of the package;
    wherein at least one of the group consisting of the support structure and the cover structure has an acoustic wave propagation influencing surface pattern;
    wherein the mems component is located in a cavity delimited between the support structure and the cover structure;
    wherein the cover structure comprises at least one of the group consisting of an electromagnetic interference protection, an electrostatic discharge protection, solder pads, and an acoustic property adjustment feature, for passive filtering of acoustic waves;
    wherein at least part of the electrically conductive contact structure is configured for electrically coupling the electronic component with the mems component.

10. The method according to claim 9, further comprising:
    providing a support master structure, wherein the support structure forms part of the support mater structure;
    mounting at least one further MEMS component on the support mater structure;
    at least partially covering the at least one further MEMS component with a cover master structure mounted on the support master structure, wherein the cover structure forms part of the cover master structure; and
embedding at least one further electronic component in at least one of the support master structure and the cover master structure.

11. The method according to claim 10, further comprising:
singularizing the arrangement of the support master structure, the cover master structure, the embedded electronic components and the mounted MEMS components to thereby obtain a plurality of packages each comprising support structure, electronic component, MEMS component and cover structure.

12. The method according to claim 10, wherein the electronic components and the MEMS components are two dimensionally distributed over the support master structure and the cover master structure.

13. An arrangement, comprising:
a support master structure comprising an electrically insulating material;
a plurality of microelectromechanical system (MEMS) components mounted on the support master structure;
a cover master structure comprising electrically insulating material, wherein the cover master structure is configured as a printed circuit board, or as a section thereof, wherein the cover master structure has a cavity, and wherein the cover master structure is mounted on the support master structure and at least partially covering the MEMS component so as to define individual cavities for each of the MEMS components between a corresponding section of the cover master structure such that each MEMS component is at least partially located in one of the cavities; and
a plurality of components embedded in at least one of the support master structure and the cover master structure;
wherein at least one of the support master structure and the cover master structure comprises an electrically conductive contact structure;
wherein the package further comprises at least one of the following features:
wherein the MEMS component is mounted on the support structure and/or on the cover structure;
wherein at least part of lateral surfaces of the electronic component is in direct contact with material of at least one of the support structure and the cover structure;
wherein at least one of the group consisting of the support structure and the cover structure comprises at least one through hole for providing fluid communication between the mems component and an environment of the package;
wherein at least one of the group consisting of the support structure and the cover structure has an acoustic wave propagation influencing surface pattern;
wherein the mems component is located in a cavity delimited between the support structure and the cover structure;
wherein the cover structure comprises at least one of the group consisting of an electromagnetic interference protection, an electrostatic discharge protection, solder pads, and an acoustic property adjustment feature, for passive filtering of acoustic waves;
wherein at least part of the electrically conductive contact structure is configured for electrically coupling the electronic component with the mems component.

* * * * *

UNITED STATES PATENT AND TRADEMARK OFFICE
CERTIFICATE OF CORRECTION

PATENT NO. : 10,745,269 B2
APPLICATION NO. : 15/525704
DATED : August 18, 2020
INVENTOR(S) : Nick Renaud-Bezot and Berhard Reitmaier Page 1 of 1

It is certified that error appears in the above-identified patent and that said Letters Patent is hereby corrected as shown below:

In the Claims

Column 15, Line 39 - "mems component" should be "MEMS component".

Column 15, Line 44 - "mems component" should be "MEMS component".

Column 15, Line 54 - "mems component" should be "MEMS component".

Column 16, Line 45 - "mems component" should be "MEMS component".

Column 16, Line 50 - "mems component" should be "MEMS component".

Column 16, Line 60 - "mems component" should be "MEMS component".

Column 18, Line 16 - "mems component" should be "MEMS component".

Column 18, Line 21 - "mems component" should be "MEMS component".

Column 18, Line 31 - "mems component" should be "MEMS component".

Signed and Sealed this
Thirteenth Day of October, 2020

Andrei Iancu
*Director of the United States Patent and Trademark Office*